(12) United States Patent
Krishnan et al.

(10) Patent No.: US 6,465,847 B1
(45) Date of Patent: Oct. 15, 2002

(54) SEMICONDUCTOR-ON-INSULATOR (SOI) DEVICE WITH HYPERABRUPT SOURCE/ DRAIN JUNCTIONS

(75) Inventors: Srinath Krishnan, Campbell, CA (US); Witold P. Maszara, Morgan Hill, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 09/878,614

(22) Filed: Jun. 11, 2001

(51) Int. Cl.$^7$ .............................................. H01L 27/01
(52) U.S. Cl. ..................... 257/347; 257/348; 257/354; 257/382
(58) Field of Search ................................ 257/347, 348, 257/354, 382

(56) References Cited

U.S. PATENT DOCUMENTS

| | | | |
|---|---|---|---|
| 4,617,066 A | | 10/1986 | Vasudev |
| 5,710,450 A | * | 1/1998 | Chau et al. .................. 257/344 |
| 5,965,917 A | * | 10/1999 | Maszara et al. ............. 257/347 |
| 6,087,234 A | | 7/2000 | Wu |
| 6,121,100 A | * | 9/2000 | Andideh et al. ............. 438/305 |
| 6,160,291 A | * | 12/2000 | Imai ........................... 257/347 |
| 6,160,293 A | * | 12/2000 | Onishi ......................... 257/347 |
| 6,165,826 A | * | 12/2000 | Chau et al. .................. 438/231 |
| 6,274,488 B1 | * | 8/2001 | Talwar et al. ................ 438/655 |
| 6,316,357 B1 | | 11/2001 | Lin |
| 6,335,253 B1 | * | 1/2002 | Chong et al. ................ 438/305 |
| 6,380,590 B1 | * | 4/2002 | Yu .............................. 257/350 |
| 6,395,587 B1 | * | 5/2002 | Crowder et al. ............. 438/149 |
| 6,403,433 B1 | * | 6/2002 | Yu et al. ...................... 438/300 |

FOREIGN PATENT DOCUMENTS

JP    2000-58842    *    2/2000

* cited by examiner

*Primary Examiner*—Nathan J. Flynn
*Assistant Examiner*—Ahmed N. Sefer
(74) *Attorney, Agent, or Firm*—Renner, Otto, Boisselle & Sklar, LLP

(57) ABSTRACT

A semiconductor-on-insulator (SOI) device. The SOI device includes a semiconductor substrate layer; an insulator layer disposed on the substrate layer; a semiconductor active region disposed on the insulator layer, the active region including a source, a drain, and a body disposed therebetween, at least one of the source and the drain forming a hyperabrupt junction with the body; and a gate disposed on the body such that the gate, source, drain and body are operatively arranged to form a transistor. The at least one of the source and drain forming the hyperabrupt junction with the body includes a silicide region. The silicide region has a generally vertical interface, which is laterally spaced apart from the hyperabrupt junction by about 60 Å to about 150 Å.

17 Claims, 4 Drawing Sheets

SEMICONDUCTOR-ON-INSULATOR (SOI) DEVICE WITH HYPERABRUPT SOURCE/ DRAIN JUNCTIONS

TECHNICAL FIELD

The invention relates generally to semiconductor-on-insulator (SOI) devices and methods for forming the same and, more particularly to controlling floating body effects and contact resistance within an SOI device.

BACKGROUND ART

Traditional semiconductor-on-insulator (SOI) integrated circuits typically have a silicon substrate having a buried oxide (BOX) layer disposed thereon. A semiconductor active layer, typically made from silicon, is disposed on the BOX layer. Within the active layer, active devices, such as transistors, are formed in active regions. The size and placement of the active regions are defined by isolation regions. As a result of this arrangement, the active devices are isolated from the substrate by the BOX layer. More specifically, a body region of each SOI transistor does not have body contacts and is therefore "floating."

SOI chips offer potential advantages over bulk chips for the fabrication of high performance integrated circuits for digital circuitry. Such digital circuitry is typically made from partially-depleted metal oxide semiconductor field effect transistors (MOSFETs). In such circuits, dielectric isolation and reduction of parasitic capacitance improve circuit performance, and virtually eliminate latch-up in CMOS circuits. In addition, circuit layout in SOI can be greatly simplified and the packing density greatly increased.

However, devices formed from SOI materials typically exhibit parasitic effects due to the presence of the floating body (i.e., "floating body effects"). These floating body effects may result in undesirable performance in SOI devices. Therefore, it will be appreciated that a need exists for SOI MOSFETs having reduced floating body effects.

SUMMARY OF THE INVENTION

According to one aspect of the invention, the invention is a semiconductor-on-insulator (SOI) device. The SOI device includes a semiconductor substrate layer; an insulator layer disposed on the substrate layer; a semiconductor active region disposed on the insulator layer, the active region including a source, a drain, and a body disposed therebetween, at least one of the source and the drain forming a hyperabrupt junction with the body region; and a gate disposed on the body such that the gate, source, drain and body are operatively arranged to form a transistor. The at least one of the source and drain forming the hyperabrupt junction with the body includes a silicide region. The silicide region has a generally vertical interface, which is laterally spaced apart from the hyperabrupt junction by about 60 Å to about 150 Å.

According to another aspect of the invention, the invention is a semiconductor-on-insulator (SOI) device. The SOI device includes a semiconductor substrate layer; an insulator layer disposed on the substrate layer; a semiconductor active region disposed on the insulator layer, the active region including a source, a drain, and a body disposed therebetween, the source and the drain forming respective hyperabrupt junctions with the body; and a gate disposed on the body such that the gate, source, drain and body are operatively arranged to form a transistor. The source and the drain each include a silicide region, the silicide regions being spaced from the respective hyperabrupt junctions by a lateral distance of less than about 100 Å.

BRIEF DESCRIPTION OF THE DRAWINGS

These and further features of the present invention will be apparent with reference to the following description and drawings, wherein.

DISCLOSURE OF THE INVENTION

Figure 1:
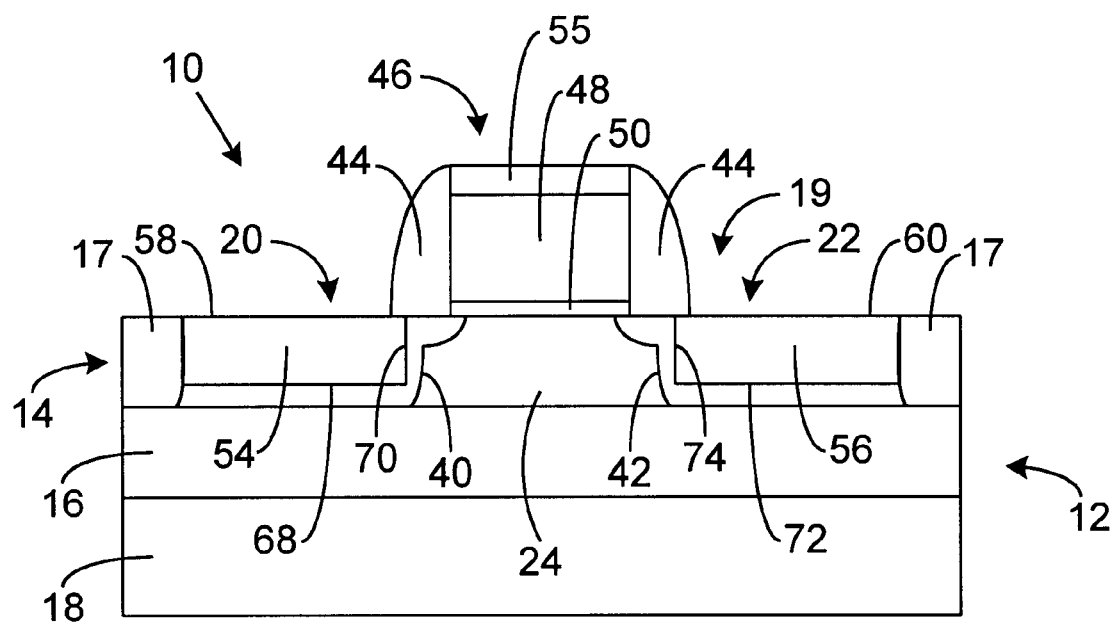
FIG. 1 is a cross-sectional view of a semiconductor-on-insulator (SOI) device in accordance with the present invention.

In the detailed description which follows, identical components have been given the same reference numerals, regardless of whether they are shown in different embodiments of the present invention. To illustrate the present invention in a clear and concise manner, the drawings may not necessarily be to scale and certain features may be shown in somewhat schematic form.

Referring initially to FIG. 1, a semiconductor-on-insulator (SOI) device 10 according to the present invention is shown. In the illustrated embodiment, the SOI device is a transistor and, more specifically, is a partially depleted metal oxide semiconductor field effect transistors (MOSFET). The device 10 is fabricated in conjunction with an SOI wafer 12. The SOI wafer includes an active layer 14 (also referred to as a semiconductor layer 14), a buried insulator layer 16 (also referred to herein as a buried oxide (BOX) layer 14), and a semiconductor substrate 18. In one embodiment, the wafer 12 has a silicon semiconductor layer 14, a silicon substrate 18, and a silicon dioxide ($SiO_2$) buried insulator layer 16.

Within the semiconductor layer 14, isolation regions 17 define the size and placement of an active region 19, the active region 19 having a source region (or source 20), a drain region (or drain 22) and a body region (or body 24) disposed therebetween. The source 20 and the drain 22 are doped as described in more detail below, such that the source 20 and the drain 22 are doped to form N-type regions or P-type regions as desired. The body 24 is doped to have opposite doping as the source 20 and the drain 22. Alternatively, the body 24 can be undoped.

The source 20 and the drain 22 each include extensions 43 (FIG. 1A) extending under sidewall spacers 44, the sidewall spacers 44 being disposed adjacent a gate stack (or gate 46). The gate 46 is disposed on top of the body 24. The gate 46 includes a gate dielectric 50 and a gate electrode 48 disposed thereon as is known in the art. The gate dielectric 50 may be formed from conventional materials, such as silicon dioxide, silicon oxynitride, or silicon nitride ($Si_3N_4$), and the gate electrode 48 can be formed from a conductive material, such as polysilicon.

The source 20 and the drain 22 also include deep implants as described below in more detail. The deep implants are doped so that a source/body hyperabrupt junction 40 is formed and a drain/body hyperabrupt junction 42 is formed. In addition, the junctions 40 and 42 are physically steep and are formed to be as vertical as possible. Therefore, the hyperabrupt junctions 40 and 42 generally extend at least from the lower edge of the extensions 43 (i.e., at the "corner" where the deep implant intersects with the extensions 43) towards the BOX layer 16. The depth of the hyperabrupt junctions 40 and 42 is defined by the depth to which the source 20 and the drain 22 are amorphized during an amorphization step carried out prior to dopant implantation. Below the amorphization depth, the doping concentration of the deep implants falls off, reducing the degree of abruptness of the source/body junction and the drain/body junction below the amorphization depth.

The device 10 also includes a source silicide region 54, a drain silicide region 56 and a gate silicide region 55. In the illustrated embodiment, the source and drain silicide regions 54 and 56 are substantially symmetric about the gate 46, although it will be appreciated that the silicide regions 54 and 56 may be asymmetrical relative to the gate 46. The silicide regions 54 and 56 have upper surfaces 58 and 60, respectively, for external electrical connection using components such as contacts, vias and conductor lines.

The illustrated source silicide region 54 interfaces the non-silicided portion of the source 20 along a lateral interface 68 and a generally vertical interface 70. The interfaces 68 and 70 are generally smooth and are generally perpendicular to one another, although a corner radius may be present at the junction where the interfaces 68 and 70 meet and the interfaces 68 and 70 may be bowed, arced or otherwise non-linear. Similarly, the drain silicide region 56 has a lateral interface 72 and a vertical interface 74, which are generally smooth and perpendicular to one another, although a corner radius may be present at the junction where the interfaces 72 and 74 meet and the interfaces 72 and 74 may be bowed, arced or otherwise non-linear.

Figure 1A:
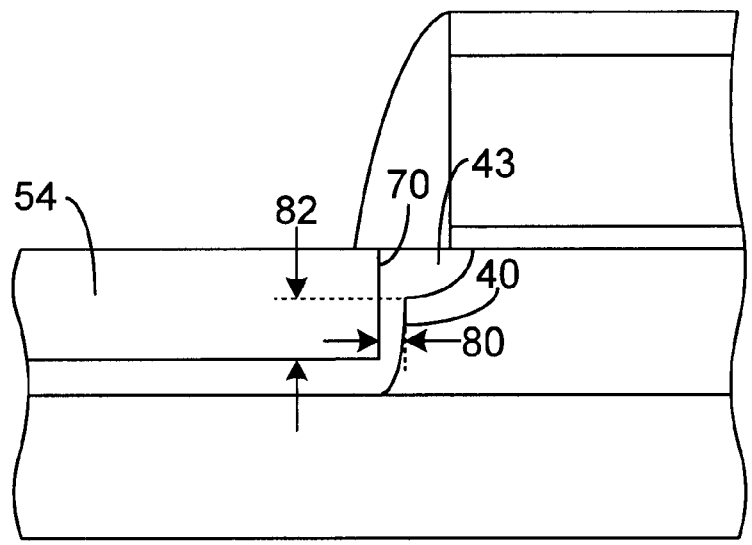
FIG. 1A is an enlarged, partial view of the SOI device of FIG. 1.

As shown in FIG. 1A, the interface 70 is laterally spaced from the hyperabrupt junction 40 as indicated by reference number 80. The lateral distance 80 is about 60 Å to about 150 Å. In another embodiment, the lateral distance is about 90 Å to about 120 Å, and in another embodiment, the lateral distance is less than about 100 Å, but not contacting the hyperabrupt junction 40. With respect to the foregoing ranges, and all other ranges and ratios herein, the range and ratio limits can be combined. As indicated by reference number 82, the interface 70 extends in a generally vertical arrangement adjacent the hyperabrupt junction 40 along a distance of about 70 Å to about 130 Å. In one embodiment, the vertical distance 82 is about 1.0 to about 1.5 times the lateral distance 80, and in one embodiment, the vertical distance 82 is about 1.2 to about 1.3 times the lateral distance 80. Similarly, the same or similar spacing parameters for the drain silicide region 56 are formed.

According to the invention, the proximity of the silicide regions 54 and 56 to the respective source/body hyperabrupt junction 40 and drain/body hyperabrupt junction 42 enhances junction recombination and reduces floating body effects. In addition, the hyperabrupt source/body junction 40 and the hyperabrupt drain/body junction 42 allows for lower contact resistance. More particularly, the proximity of the silicide regions 54 and 56 to the hyperabrupt junctions 40 and 42 tends to make the device 10 more leaky. However, in the presence of these leaky diode junctions, the silicide may have a tendency to attract with lightly doped portions of the junction, increasing the tunneling barrier and, thus, increasing the contact resistance. In the present invention, the hyperabrupt nature of the junctions 40 and 42 allows for the placement of the silicide interfaces 70 and 74 to be in close proximity thereto (e.g., a distance of less than 100 Å).

Figure 2:
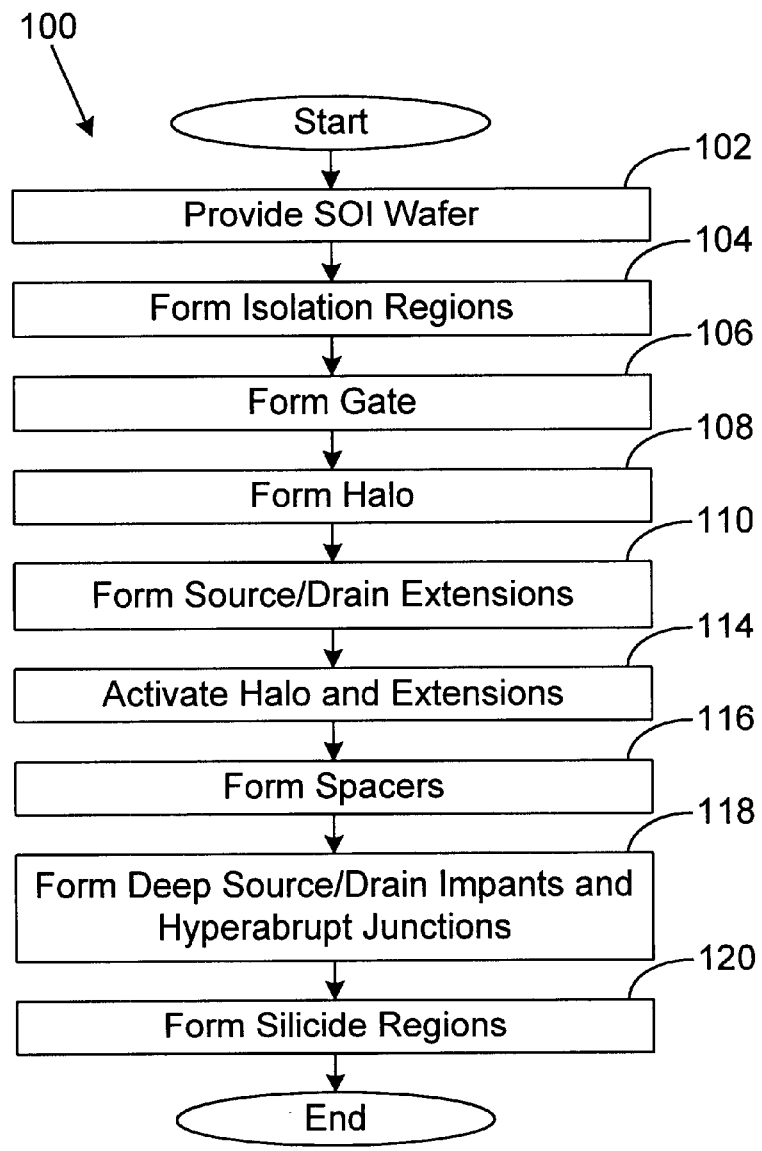
FIG. 2 is a flow chart of a method of making the SOI device of FIG. 1.
Figure 3:
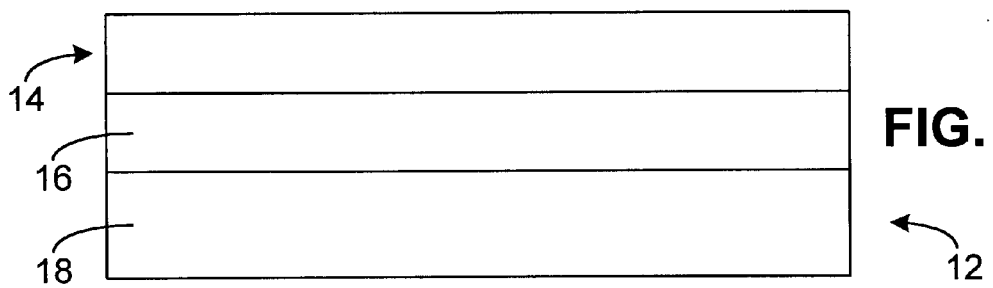
FIGS. 3–9 are cross-sectional views of SOI in various stages of fabrication.

FIG. 2 is a flow chart of a method 100 for forming the device 10. In step 102 and as illustrated in FIG. 3, an SOI wafer 110 is provided. As mentioned, the SOI wafer 12 includes the substrate 18, the active, or semiconductor, layer 14 and the BOX layer 16 disposed therebetween. The semiconductor layer 14 may be suitably doped for the formation of a device with a body having P or N type doping. The wafer 12 may be formed using techniques known in the art, such as a wafer bonding technique of a separated by implanted oxygen (SIMOX) technique.

Figure 4:
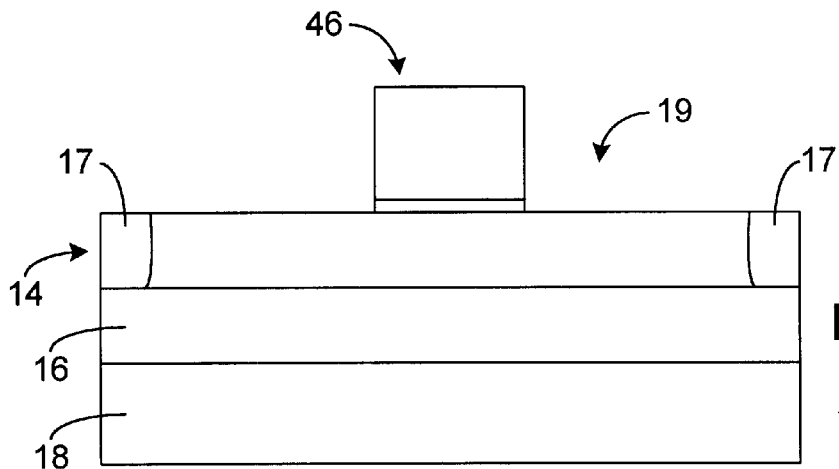

Thereafter, in step 104 and as illustrated in FIG. 4, isolation regions 17 are formed to define the active region 19. In step 106 and as illustrated in FIG. 4, the gate 46, including the gate dielectric 50 and the gate electrode 48, is formed using conventional techniques. For example, a layer of dielectric material (e.g., $SiO_2$ or $Si_3N_4$) may be deposited on and/or grown on the semiconductor layer 14. Thereafter a layer of conductive gate electrode material (e.g., polysilicon) may be deposited on the layer of dielectric material by using, for example, low pressure chemical vapor deposition (LPCVD). The dielectric and electrode materials may be selectively removed, for example by well-known photolithography and selective etching methods, to form the gate 46 in a desired location. An example of a suitable etching method is reactive ion etching (RIE), using an appropriate etchant. It will be appreciated that a wide variety of other suitable gate structures as are known in the art may be formed in step 106. In addition, the gate 46 can be pre-doped and activated using known techniques.

In step 108, a halo can be implanted as is well known in the art.

Figure 5:
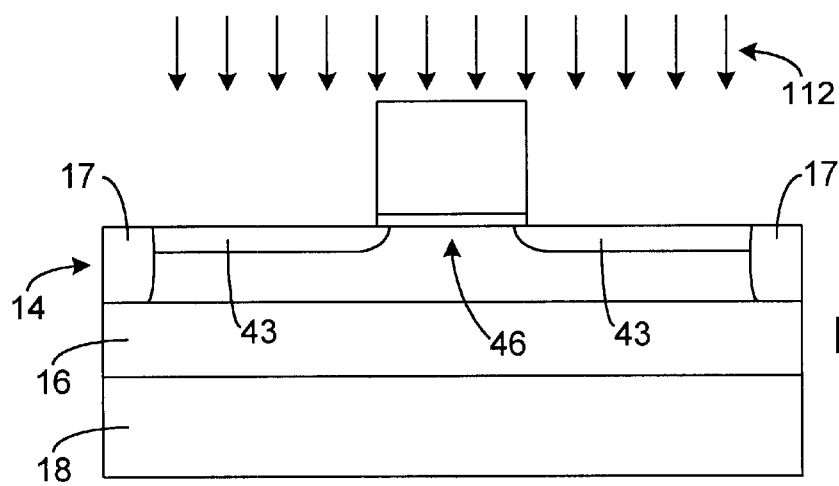

In step 110 and as illustrated in FIG. 5, respective source 20 and drain 22 extensions 43 are formed by implanting ions 112 using, for example, a lightly doped drain (LDD) technique. Exemplary ions 112 for extension 43 formation include phosphorous or arsenic to establish N-type doping and boron or antimony to establish P-type doping. An exemplary implantation energy range is about 5 to 80 KeV, and an exemplary dosage range is about $1\times10^{12}$ to about $5\times10^{15}$ atoms/cm$^2$. It will be appreciated that the gate 46 acts as a self-aligned mask during extension 43 formation. Some dopant may diffuse under the gate 46 as is conventional. It will further be appreciated that, if desired, a separate doping mask or temporary spacer may be used in place of or in addition to the gate 46. Thereafter, in step 114, the halo (if formed) and the extensions 43 are activated with a thermal cycle, such as a rapid temperature anneal (RTA).

As an alternative, the extensions 43 can be formed using a solid phase epitaxy (SPE) process. More specifically, SPE is used to amorphize the semiconductor layer 14 with ion species, such as, silicon or germanium. The energy and dosage of the ion species can be determined empirically for the device being fabricated. Next, dopant is implanted to achieve the desired N-type or P-type doping and then the semiconductor layer 14 is recrystalized using a low temperature anneal (i.e., at a temperature of less than about 700° C.).

Figure 6:
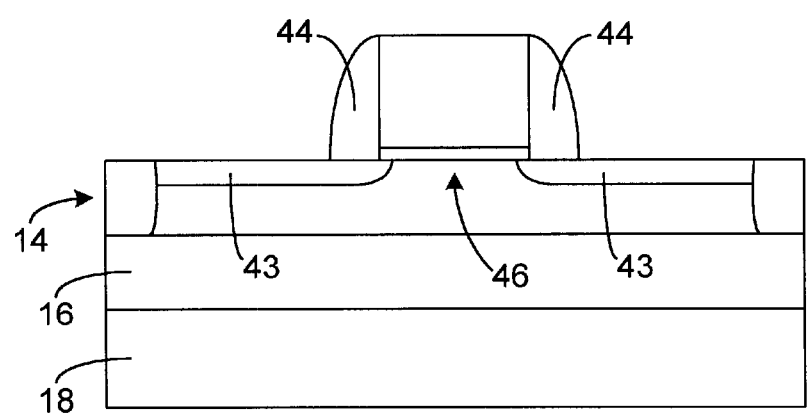

Referring to FIG. 6, in step 116, the side wall spacers 44 are formed adjacent the gate 46. The spacers 44 are formed using conventional techniques and are made from a material such as silicon oxide ($SiO_2$) or a nitride (e.g., $Si_3Na$).

Figure 7:
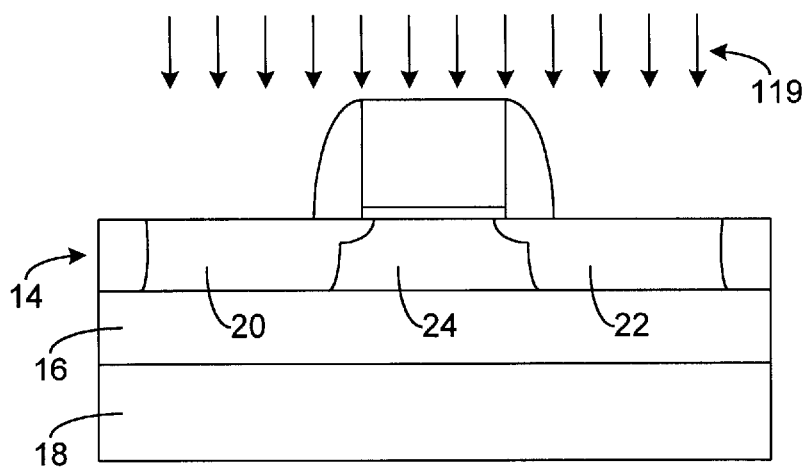

In step 118 and as illustrated in FIG. 7, source 20 and drain 22 deep implant regions are formed, thereby forming the source 20 and the drain 22 from the respective deep implant regions and the extensions 43. In one embodiment, the deep implants are formed using an SPE process. More specifically, SPE is used to amorphize the semiconductor layer 14 with ion species, such as silicon or germanium. The energy and dosage of the ion species can be determined empirically for the device being fabricated. In one embodiment, silicon ions are used to amorphize the semiconductor layer 14 and an exemplary energy range is about 5 keV to about 100 keV and an exemplary dosage range is about $1\times10^{15}$ atoms/cm$^2$ to about $1\times10^{16}$ atoms/cm$^2$. Next, dopant is implanted with ions 119 to achieve the desired N-type of P-type doping and then the semiconductor layer 14 is recrystalized using a low temperature anneal (i.e., at a temperature of less than about 700° C.).

The semiconductor layer 14 is amorphized to a desired depth, wherein the depth defines the depth of the hyperabrupt junctions formed along the diode interfaces between the source 20 and the body 24 and between the drain 22 and the body 24, respectively. The gate 46 and the spacers 44 act as a self aligned mask during ion 119 implantation, however, some diffusion of the implanted ions 119 under the spacers 44 will generally occur as is known in the art. Exemplary ions 119 include phosphorous or arsenic to establish N-type doping and boron or antimony to establish P-type doping. An exemplary energy range for the deep implantation 182 is about 5 KeV to about 50 KeV, depending of the dopant species. An exemplary dosage range for the deep implantation is about $1\times10^{15}$ atoms/cm$^2$ to about $1\times10^{16}$ atoms/cm$^2$.

Following step 118, an exemplary range of concentrations of the dopants in the source 20 and the drain 22 at or near the hyperabrupt junctions 40 and 42 is about $1\times10^{20}$ atoms/cm$^3$ or greater. An exemplary range of concentrations of the dopants in the body 24 at or near the hyperabrupt junctions 40 and 42 is about $1\times10^{15}$ atoms/cm$^3$ to about $1\times10^{19}$ atoms/cm$^3$.

Figure 8:
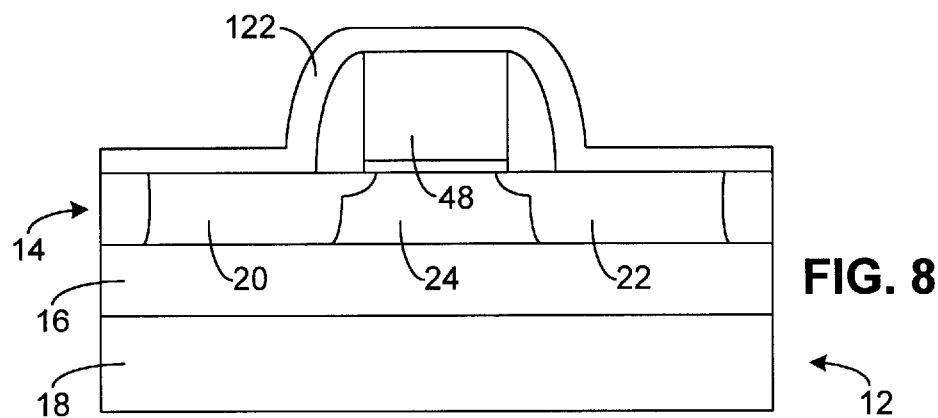
Figure 9:
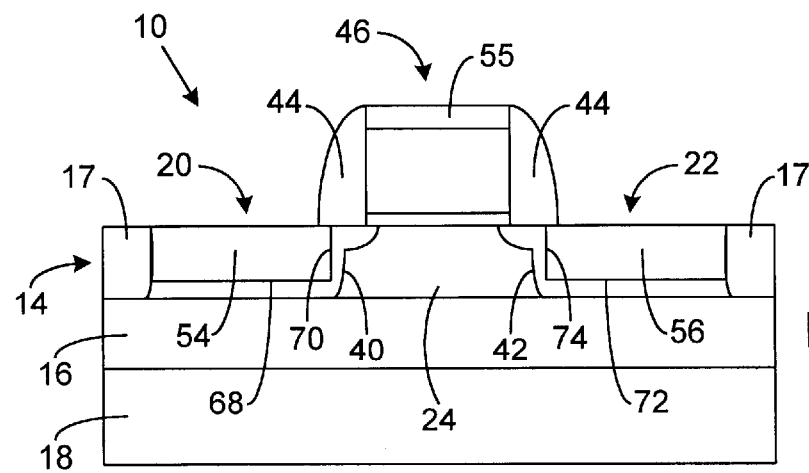

In step 120 and as illustrated in FIG. 8, silicide formation is initiated by depositing a layer of metal 122 upon the gate 46, the spacers 44, and the exposed portions of the semiconductor layer 14 in at least the area of the active region 19. The metal layer 122 is formed from a suitable metal, such as titanium, cobalt, or nickel. The metal layer 122 may be deposited, for example, by sputtering. Silicide is formed by reacting the metal layer 220 with the portions of the source 20, the drain 22 and the gate electrode 48 that are in contact with the metal layer 122 using one of a number of silicidation or salication processes and thereby forming the silicide regions 54, 56 and 55 discussed above. An exemplary method includes annealing by raising the temperature of the semiconductor device 10 being formed to a suitable level (e.g., about 500° C. to about 700° C.) for a suitable length of time (e.g., about 10 seconds to about 10 minutes). Rapid thermal annealing (RTA) may also be employed, for example at a temperature of about 600° C. to about 900° C. for about 5 second to about 120 seconds. It will be appreciated that other temperatures and heating times may be employed.

As illustrated, the silicide regions 54 and 56 will tend to encroach underneath the spacers 44. In one embodiment, the silicide regions 54 and 56 will encroach under the spacers a lateral distance of about zero Å to about 100 Å.

As mentioned, the vertical interfaces 70 and 72 and the lateral interfaces 68 and 72 of the respective silicide regions 54 and 56 are smooth. Various techniques to control the roughness of silicide formation are known in the art. For example, if titanium is used in the silicidation or salication process, a pre-amorphization implant (PAI) to form a layer of amorphous silicon on or in the source 20 and drain 22 can be carried out to control the silicide interface smoothness and to lower the interface sheet resistance. Excess metal of the metal layer 122 can be removed by conventional, well-known methods.

As discussed above, the proximity of the silicide regions 54 and 56 to the respective hyperabrupt junctions 60 and 62 enhances junction recombination, thereby reducing floating body effects. In addition, the hyperabrupt junctions 60 and 62 lowers contact resistance within the device 10. As a result, overall operational performance of the device is improved.

Although particular embodiments of the invention have been described in detail, it is understood that the invention is not limited correspondingly in scope, but includes all changes, modifications and equivalents coming within the spirit and terms of the claims appended hereto.

What is claimed is:

1. A semiconductor-on-insulator (SOI) device comprising:

a semiconductor substrate layer;

an insulator layer disposed on the substrate layer;

a semiconductor active region disposed on the insulator layer, the active region including a source, a drain, and a body disposed therebetween, each of the source and the drain having an extension region and a deep doped region, at least one of the source and the drain forming a hyperabrupt junction with the body, the hyperabrupt junction extending downward from an extension junction depth and along a junction of the deep doped and body regions; and a gate having a gate electrode separated from the semiconductor active region by a gate dielectric and a sidewall spacer for defining deep doped region formation disposed adjacent each lateral sidewall of the gate electrode, the gate electrode disposed over the body such that the gate, source, drain and body are operatively arranged to form a transistor;

wherein the at least one of the source and drain forming the hyperabrupt junction with the body includes a silicide region, the silicide region having a generally vertical interface, the generally vertical interface being laterally spaced apart from the hyperabrupt junction by about 60 Å to about 150 Å and the silicide region laterally extending under a respective one of the sidewall spacers towards the body and wherein the hyperabrupt junction has a depth corresponding to an amorphizing depth achieved during an amorphization of the at least one of the source and drain.

2. An SOI device as set forth in claim 1, wherein the vertical interface is laterally spaced apart from the hyperabrupt junction by a distance which is less than 100 Å.

3. An SOI device as set forth in claim 1, wherein the generally vertical interface extends adjacent the hyperabrupt junction along a vertical distance of about 70 Å to about 130 Å.

4. An SOI device as set forth in claim 1, wherein the other of the at least one of the source and the drain form a second hyperabrupt junction with the body, the second hyperabrupt junction extending downward from an extension junction depth and along a junction of the deep doped region and body regions, the other of the at least one of the source and the drain having a second silicide region having a generally vertical interface being laterally spaced apart from the respective hyperabrupt junction by about 60 Å to about 150 Å and the second silicide region laterally extending under a respective one of the sidewall spacers towards the body.

5. An SOI device as set forth in claim 4, wherein the source silicide region and drain silicide region are substantially symmetric with one another about the gate.

6. An SOI device as set forth in claim 4, wherein the generally vertical interfaces of each of the silicide regions extend adjacent the respective hyperabrupt junctions along a vertical distance of about 70 Å to about 130 Å.

7. An SOI device as set forth in claim 1, wherein the hyperabrupt junction has a depth spaced above the insulating layer.

8. An SOI device as set forth in claim 1, wherein the generally vertical interface extends adjacent the hyperabrupt junction for a vertical distance that is about 1.0 to about 1.5 times the lateral distance from the hyperabrupt junction to the generally vertical interface.

9. An SOI device as set forth in claim 1, wherein the generally vertical interface extends adjacent the hyperabrupt junction for a vertical distance that is about 1.2 to about 1.3 times the lateral distance from the hyperabrupt junction to the generally vertical interface.

10. An SOI device as set forth in claim 1, wherein a dopant concentration in the at least one of the source and drain adjacent the hyperabrupt junction is about $1 \times 10^{20}$ atoms/cm$^3$ or more and a dopant concentration in the body adjacent the hyperabrupt junction is about $1 \times 10^{15}$ atoms/cm$^3$ to about $1 \times 10^{19}$ atoms/cm$^3$.

11. An SOI device as set forth in the claim 1, wherein the silicide region laterally extends under the respective sidewall spacer a distance of up to about 100 Å.

12. A semiconductor-on-insulator (SOI) device comprising:
   a semiconductor substrate layer;
   an insulator layer disposed on the substrate layer;
   a semiconductor active region disposed on the insulator layer, the active region including a source, a drain, and a body disposed therebetween, each of the source and the drain having an extension region and a deep doped region, the source and the drain forming respective hyperabrupt junctions with the body, the hyperabrupt junction extending downward from an extension junction depth and along a junction of the deep doped and body regions; and
   a gate having a gate electrode separated from the semiconductor active region by a gate dielectric and a sidewall spacer for defining deep doped region formation disposed adjacent each lateral sidewall of the gate electrode, the gate electrode disposed over the body such that the gate, source, drain and body are operatively arranged to form a transistor;
   wherein the source and the drain each include a silicide region, the silicide regions being spaced from the respective hyperabrupt junctions by a lateral distance of less than about 100 Å and wherein the hyperabrupt junctions have a depth corresponding to an amorphizing depth achieved during an amorphization of the source and the drain.

13. An SOI device as set forth in claim 12, wherein the silicide regions each have a generally vertical interface, the generally vertical interfaces extending adjacent the respective hyperabrupt junctions along a vertical distance of about 70 Å to about 130 Å.

14. An SOI device as set forth in claim 12, wherein the hyperabrupt junctions have a depth spaced above the insulating layer.

15. An SOI device as set forth in claim 12, wherein the suicide regions each have a generally vertical interface and each generally vertical interface extends adjacent the respective hyperabrupt junction for a vertical distance that is about 1.0 to about 1.5 times the lateral distance from the respective hyperabrupt junction to the generally vertical interface.

16. An SOI device as set forth in claim 12, wherein a dopant concentration in the source and the drain adjacent the respective hyperabrupt junctions is about $1 \times 10^{20}$ atoms/cm$^3$ or more and a dopant concentration in the body adjacent the hyperabrupt junction is about $1 \times 10^{15}$ atoms/cm$^3$ to about $1 \times 10^{19}$ atoms/cm$^3$.

17. An SOI device as set forth in the claim 12, wherein the silicide regions laterally extend under the respective sidewall spacers a distance of up to about 100 Å.

* * * * *